United States Patent [19]

Brown et al.

[11] Patent Number: 4,761,106
[45] Date of Patent: Aug. 2, 1988

[54] PART FEEDER

[75] Inventors: Robert N. Brown, Los Gatos; James J. Farquhar, San Jose, both of Calif.

[73] Assignee: Alliance Automation Systems, Inc., Rochester, N.Y.

[21] Appl. No.: 917,046

[22] Filed: Oct. 9, 1986

[51] Int. Cl.⁴ .................. B65G 59/06; B65G 65/23; H05K 13/02
[52] U.S. Cl. .................. 414/125; 221/11; 414/224; 414/403; 414/413; 414/421
[58] Field of Search ............... 414/125, 131, 403, 404, 414/413, 415, 419, 421, 425, 330, 224, 128; 221/11; 29/741, 759, 809

[56] References Cited

U.S. PATENT DOCUMENTS

| 4,149,311 | 4/1979 | Benson et al. | 29/741 |
| 4,194,865 | 3/1980 | Bandoh | 414/403 |
| 4,234,418 | 11/1980 | Boissicat | 29/741 X |
| 4,575,301 | 3/1986 | Lodi et al. | 414/421 X |
| 4,599,026 | 7/1986 | Feiber et al. | 414/413 X |
| 4,618,305 | 10/1986 | Cedrone et al. | 414/403 |
| 4,629,387 | 12/1986 | Stillman et al. | 414/421 X |
| 4,647,269 | 3/1987 | Wedel et al. | 414/403 X |

FOREIGN PATENT DOCUMENTS

| 172326 | 9/1984 | Japan | 414/413 |
| 197518 | 10/1985 | Japan | 414/413 |

Primary Examiner—Robert J. Spar
Assistant Examiner—David A. Bucci
Attorney, Agent, or Firm—Gerald L. Moore; John R. Benefiel; Raymond J. Eifler

[57] ABSTRACT

A part feeder capable of moving individual parts to a receiver from a storage tube having an internal track therein generally conforming to at least a portion of the vertical cross-section of parts stored within the tube to permit the parts to freely slide along the track within the tube. The part feeder comprises a base; a horizontally movable support member slidably mounted on the base; a tiltable arm member pivotally mounted on the support member; and a receiver on the tiltable arm member. An air cylinder is provided for releasably securing one end of the tube on the arm member against the receiver. Another actuator is provided for tilting the arm member so that the end of the tube adjacent the receiver is sufficiently lower than the remainder of the tube to permit one part to slide out of the tube onto the receiver. The tube is then returned to a horizontal position. In a preferred embodiment, the device further stores additional tubes with parts therein for replacing an empty tube with a full tube by energization of a third actuator.

15 Claims, 10 Drawing Sheets

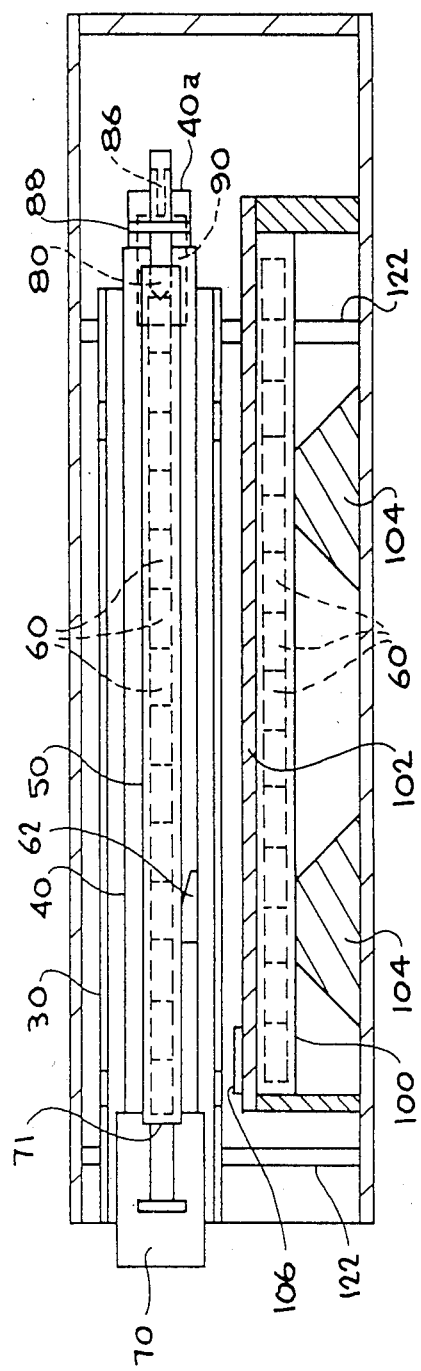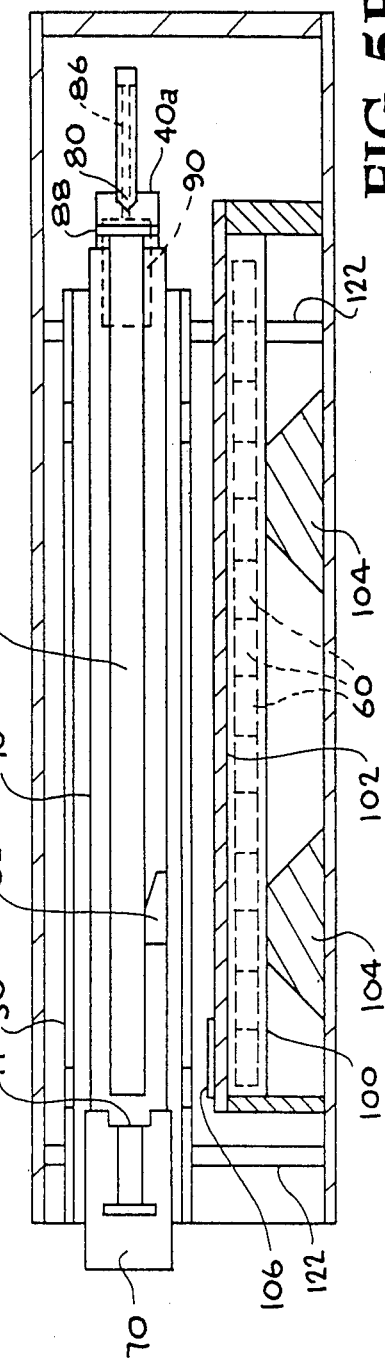

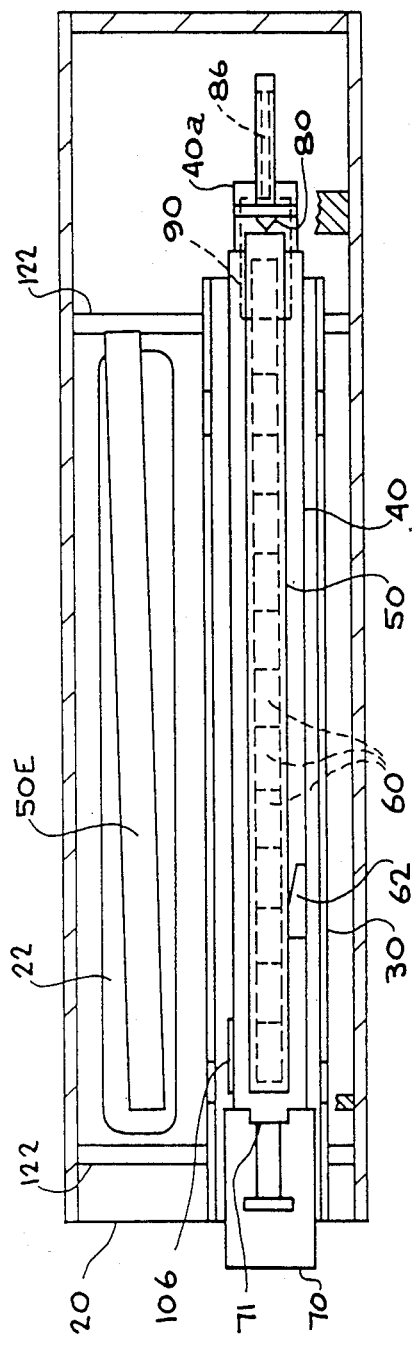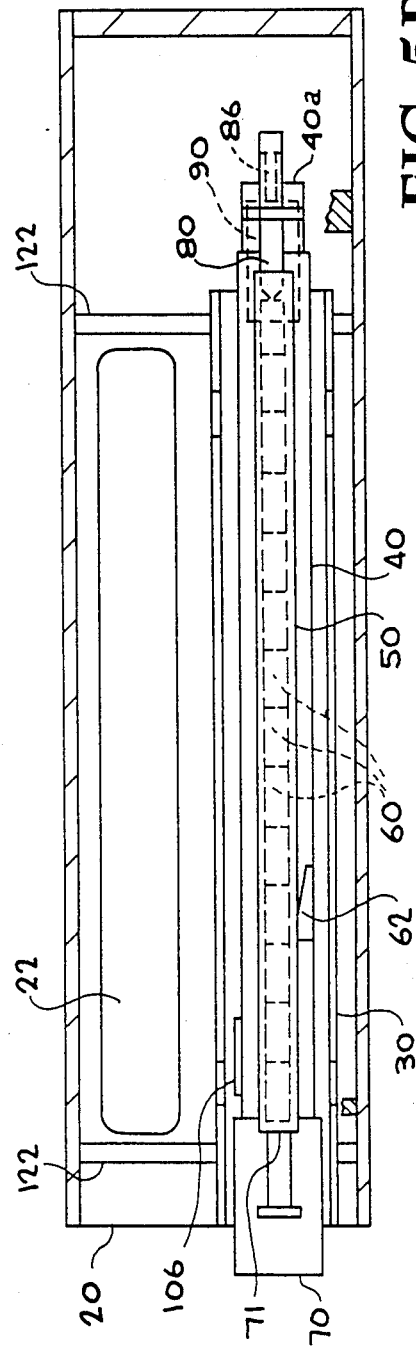

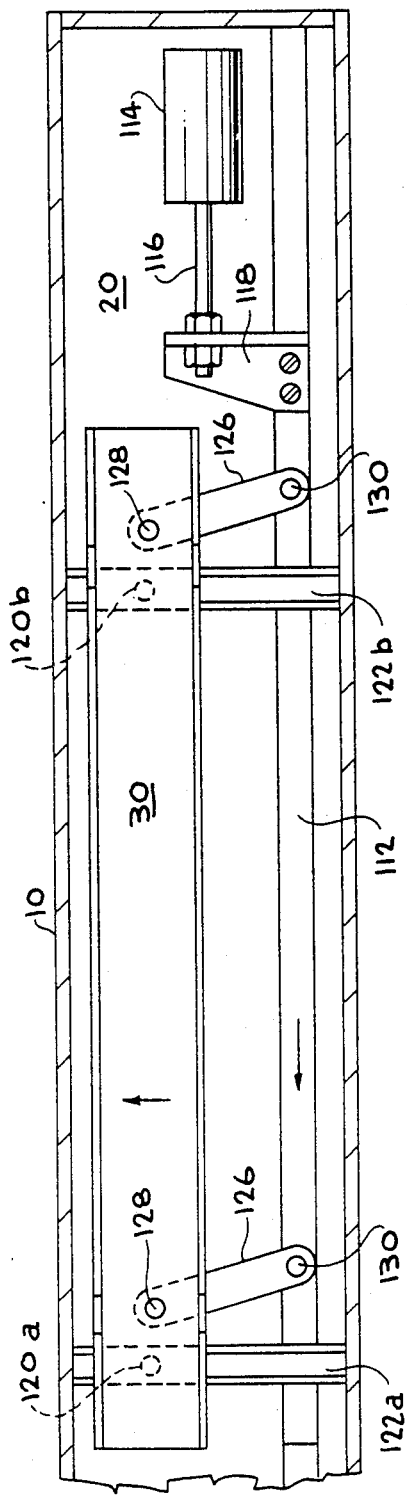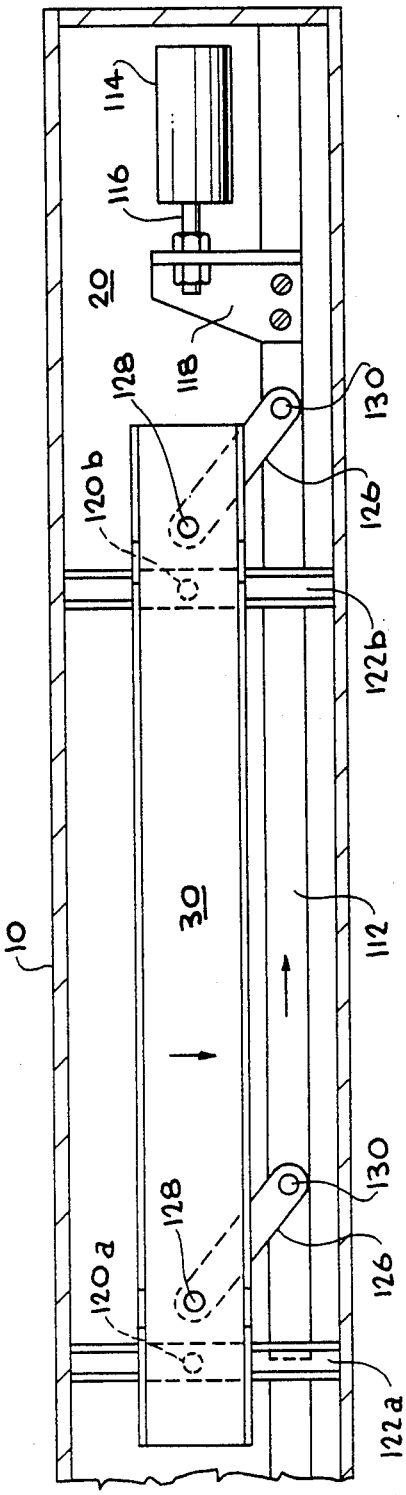

PART FEEDER

BACKGROUND OF THE INVENTION

1. Field of the Invention

This invention relates to the individual dispensing of parts from a tube. In a preferred embodiment, the invention relates to the individual dispensing of parts, particularly electronic parts, from a tube to a work station.

2. Description of the Prior Art

Packaged parts, for example, electronic parts such as integrated circuit chips of the DIP type, are usually stored in narrow transparent plastic tubes which generally conform to the height and width of the part, thus permitting a series of the parts to be stored end to end lengthwise. It is also customary to provide the tube with a track or escapement on which the underside of each part rests. The sidewalls of the tube and the track assist in maintaining the parts in end to end orientation and facilitates removal of the parts from the tube.

Conventionally, the parts may be removed by hand by sliding them out one at a time. With automation techniques being developed to provide robotic insertion of the part, for example, into a socket on a printed circuit board, removal of parts from the tube by machine has led to the use of either slide mechanisms to push the parts from one end of the tube to emerge from the other end or gravity feed mechanisms in which the tube is maintained in a vertical position or at least at an angle to the horizontal to permit the parts to slide out of the tube by gravity.

However, with such techniques, jamups, multiple feeding, and ease of replacing the empty tube with another full tube after the last part is dispensed have all presented problems.

It would, therefore be desirable to provide a feed mechanism to dispense parts from a tube which would deliver one part at a time to a work station and wherein an empty tube could be automatically replaced with a full tube from a storage area which, in turn could be restocked without interfering with the feeding of parts from the tube being emptied.

SUMMARY OF THE INVENTION

It is, therefore, an object of this invention to provide a part feeder capable of individually feeding parts from a tube to a work station in a manner which will prevent jamups and double feeding.

It is another object of this invention to provide a part feeder capable of individually feeding parts from a tube to a work station by tilting a normally horizontally disposed tube to permit individual dispensing of a part to a work station followed by return of the tube to a horizontal position to prevent double feeding and to relieve pressure on adjacent parts still in the tube to thereby prevent jamups.

It is yet another object of this invention to provide a part feeder wherein a tube containing parts is tilted from a horizontal position wherein the tilting angle, the speed of the tilt, and the jerking of the tilting may all be individually controlled to facilitate removal of the parts from the tube.

It is still another object of this invention to provide a part feeder which will provide individual feeding of parts from a tube to a work station and permit an empty tube to be automatically ejected and replaced by a full tube from an adjacent storage area comprising a vertical stack of additional horizontal full tubes, all within the footprint of the feeder.

It is a further object of this invention to provide a part feeder which will provide individual feeding of parts from a tube to a work station using the tube as the exit track to feed the parts to the work station.

It is a still further object of this invention to provide a part feeder which will permit individual feeding of parts from a tube to a work station while permitting an adjacent storage area to be replenished with additional full tubes without interfering with the individual feeding of parts to the work station.

These and other objects of the invention will be apparent from the following description and accompanying drawings.

BRIEF DESCRIPTION OF THE DRAWINGS

FIGS. 5A–5D are sequential top views of a portion of the feeder mechanism of the invention showing the tube containing parts in various sequences of being moved into place to feed parts therefrom.

FIG. 11 is a fragmentary top view of the mechanism used to move the support member into position to receive a full tube of parts from a tube storage area.

FIG. 12 is a fragmentary top view of the mechanism of FIG. 11 with the support member moved into a position to receive a full tube of parts from the full tube storage area.

DESCRIPTION OF THE PREFERRED EMBODIMENTS

Figure 1:
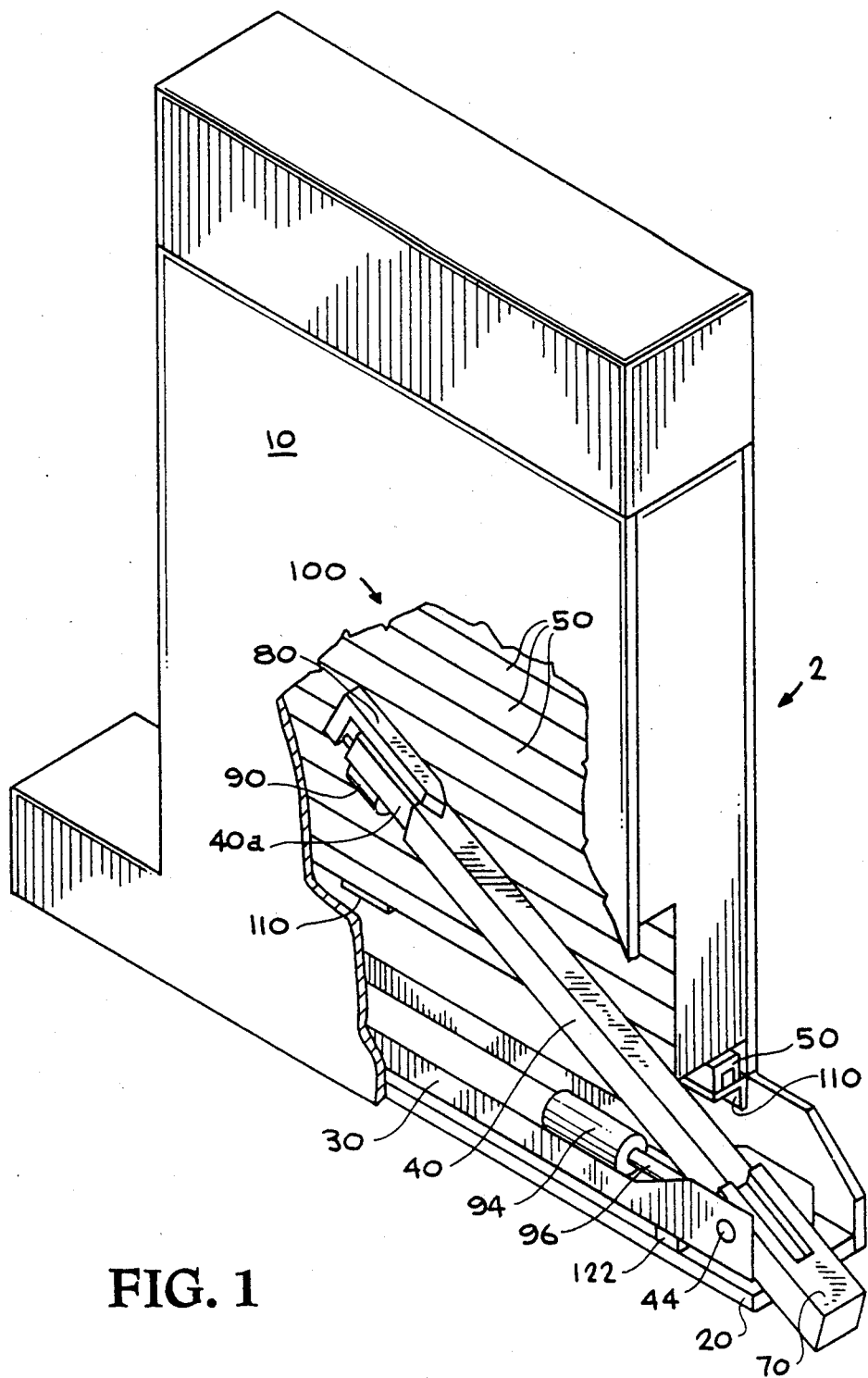
FIG. 1 is a partially cutaway isometric view of the device of the invention.
Figure 1A:
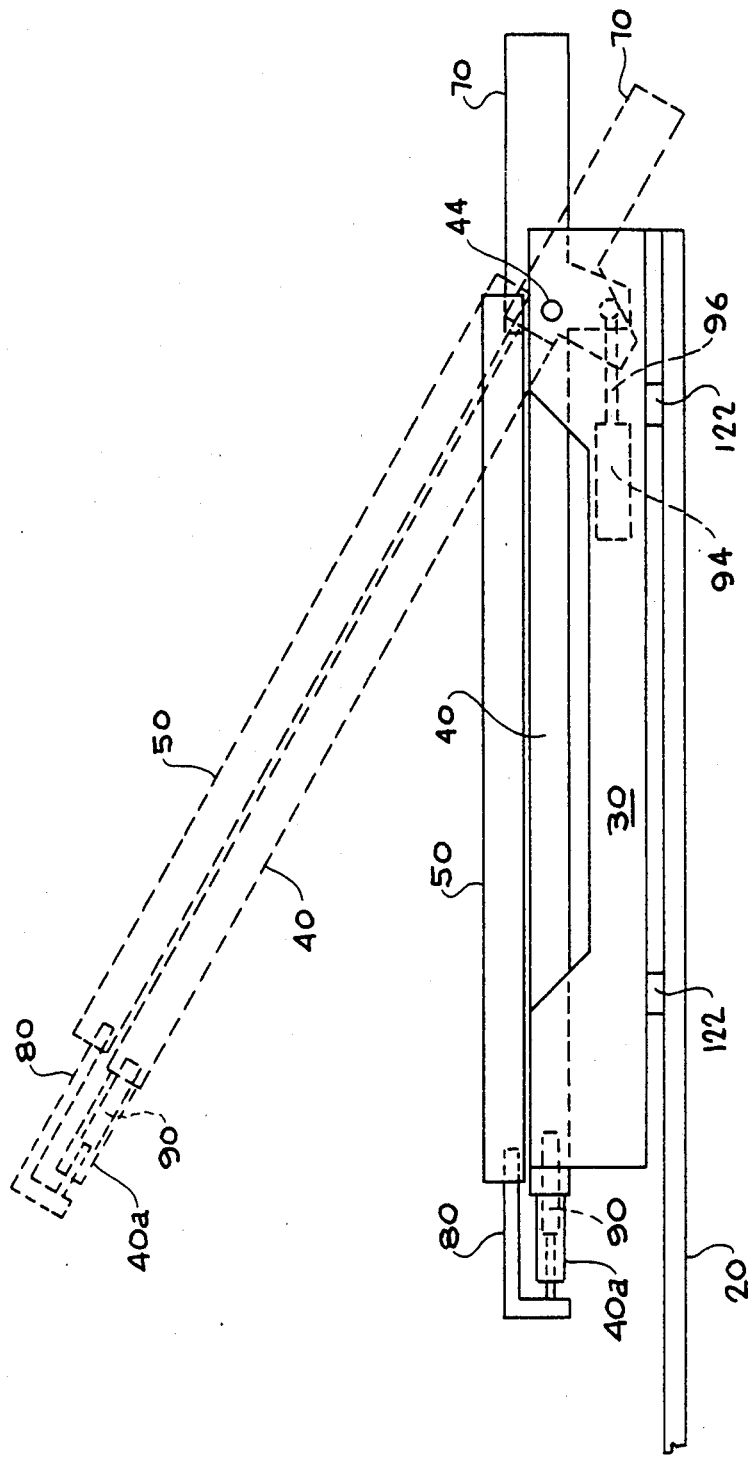
FIG. 1A is a vertical cross-section view of a portion of the device of the invention shown in FIG. 1 with the movable arm shown in a raised position in phantom lines.

Turning now to FIGS. 1 and 1A, the part feeder of the invention is generally illustrated at 2, comprising a case 10 in which is mounted a base 20. Slideably mounted on base 20 is a support member 30 to which is pivotally affixed at 44 a tiltable arm 40 having mounted thereto an adjustable extension portion 40a which telescopes into arm 40 to adjust the effective length of arm 40. Mounted to the end of extension portion 40a is an air cylinder 90 with a piston rod 86 which urges a tube engaging member into engagement with the end of a tube 50 containing parts to be fed to a work station 70 on the opposite end of the arm 40.

Figure 2:
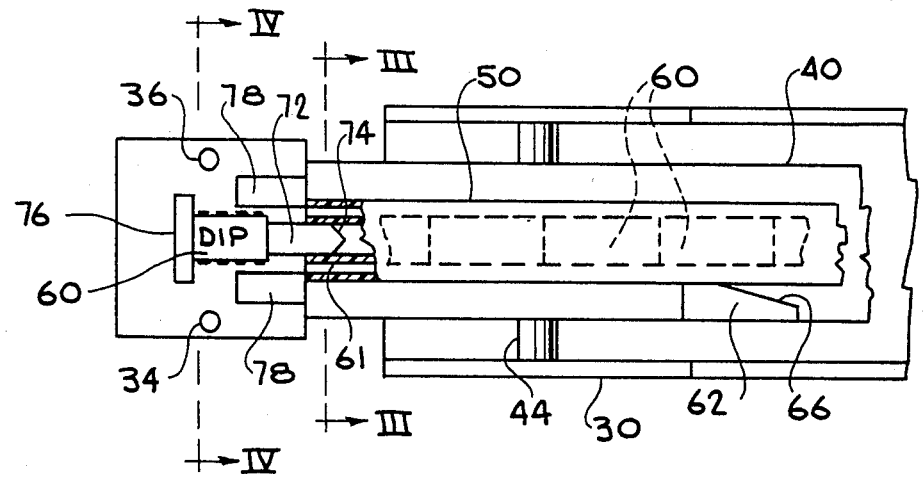
FIG. 2 is a fragmentary top view of a portion of the device of the invention.

As shown in FIG. 2, arm 40 is also provided with other appendages, as will be described below, to support and position tube 50 containing a number of of parts 60. Parts 60 may comprise any type of part such as electronic parts which will be inserted by a robot arm into a printed circuit board. By way of illustration and not of limitation, parts 60 will be illustrated herein as integrated circuit packages or "chips" of the dual-in-line rectangular package (DIP) type having two parallel spaced apart rows of pins depending perpendicular from opposite long edges of the bottom of the rectangular part. It will be understood, however, that the invention may be used in connection with the dispensing of any kind of part which may be slideably received in a storage tube which will permit the part to slide in the tube while maintaining a particular orientation with respect to the tube.

Figure 3:
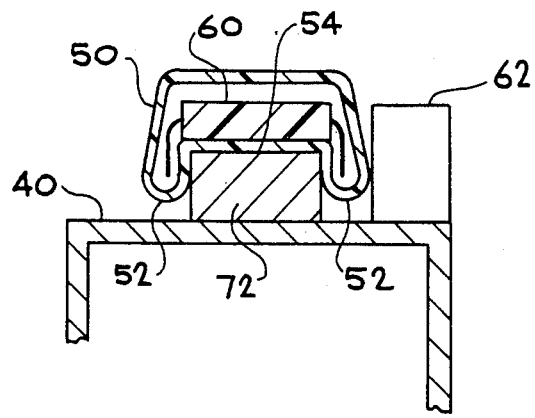
FIG. 3 is a vertical cross-section view of a portion of FIG. 2 taken along lines III—III.

Tube 50, as shown in cross-section in FIG. 3, comprises a cross-sectional shape which corresponds to the particular shape of the part. Thus, in the illustrated example of the dispensing of DIP packages, tube 50 is provided with depending portions 52 to accommodate the pins 61 (see FIG. 4) of part 60 with a raised center section 54 between depending portions 52 to support the underside of rectangular part 60. Depending portions 52 and raised section 54 of tube 50 form an internal track in tube 50 on which each of the parts 60 may slide to facilitate removal of the parts from tube 50.

Figure 3A:
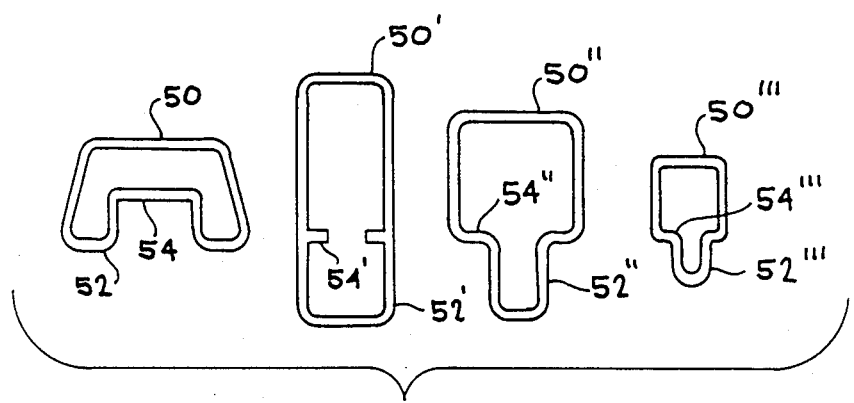
FIG. 3A is a vertical cross-sectional view of alternate cross-sectional shapes of the part tube shown in FIG. 3.

Thus, by dimensioning both the width and height of tube 50 to approximately the width and height of part 60 coupled with the provision of an internal track beneath the part on which the part may slide, a series of parts may be stacked end to end in the tube and removed one by one by sliding them out one end of tube 50. Examples of alternate cross-sectional shapes of tube 50, designated as 50', 50'', and 50''', are shown together with tube 50 in FIG. 3A.

As mentioned above, at one end of arm 40, adjacent one end of tube 50, is located a work station 70 which, in accordance with the invention, will receive a single part from tube 50. The particular shape of the work station will depend upon the shape and type of part to be dispensed from tube 50. Work station 70 is therefore designed as an independent member which can be interchangably mounted on the end of arm 40.

Each work station 70, therefore, will be different, depending upon the shape and type of part and the particular need for orientation or clamping of the part to enable proper interface with robotic grippers or end effectors to properly engage the part. Preferably, however, each work station 70 will be provided with a sensor means to sense the presence or absence of a part in the work station indicative of tube 50 being empty or jammed. Such a sensor is shown in FIG. 2 comprising a photoelectric cell 34 and a light source 36.

Figure 4:
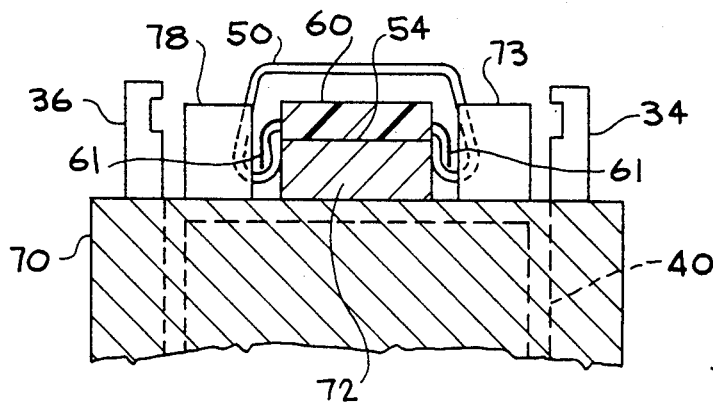
FIG. 4 is a vertical cross-section view of a portion of FIG. 2 taken along lines IV—IV.

Work station 70 of the illustrated embodiment, designed for the dispensing of DIP-type integrated circuit chips as best seen in FIGS. 2 and 4, comprises an upright part receiving member or receiver 72, which, in the illustrated embodiment, is anvil shaped having pointed or cammed sides 74 facing tube 50. The height and width of part receiving member 72 is approximately that of support surface 54 whereby part receiving member 72 may act as an extension of the aforementioned internal track in tube 50 so that a part 60 may smoothly slide from the adjacent end of tube 50 onto part receiving member 72 as will be described below. Cammed sides 74 provide lateral alignment for part 60 by contacting depending pins 61 on part 60 as it slides from tube 50 onto part receiving member 72. It will be noted again that while the shape of part receiving member will change with different parts, it should be in conformity with the shape of the track or part support portion 54 of tube 50 to facilitate smooth movement of a part from tube 50 onto part receiving member 72.

Work station 70 may further comprise an end stop 76 to prevent part 60 from sliding off the end of part receiving member 72 and side stops 78 which are positioned parallel to part receiving member 72 but sufficiently far apart to not interfere with the exit of part 60 from tube 50 onto part receiving member 72. Side stops 78, in the illustrated embodiment, provide a stop for the end of tube 50 to laterally locate tube 50 along the length of arm 40 with respect to part receiving member 72.

Tube 50 is urged against an appropriate stop in station 70, e.g., notch 71, by a fluid power means 90 such as an air cylinder which is mounted on tilting arm extension 40a. When fluid power means 90 is actuated in a forward direction toward tube 50, a piston rod 86, operationally attached to fluid power means 90, forces a wedge shaped member 80 attached to the end thereof into the end of tube 50 and urges tube against work station 70 into an appropriate receiving means in work station 70 such as notch 71 shown in FIGS. 5A–5D.

Wedged shape member 80, which is removably attached to the end of piston rod 86, is dimensioned to generally conform to the dimensions of the particular parts tube to slightly flex the sidewalls of the tube as it penetrates the end thereof since tube 50 generally will be constructed from a flexible plastic material. This removably secures tube 50 to wedge 80 thereby permitting withdrawal of tube 50 from work station 70 when the supply of parts 60 therein is exhausted as will be described below. Thus, when all of the parts 60 in tube 50 have been removed, fluid power means 90 may be actuated in the opposite direction to withdraw member 80 and tube 50 thereon from work station 70 to permit removal of empty tube 50 and replacement with a full tube.

It will be noted in this regard that the length of arm 40 may be adjusted to accommodate a number of different lengths of tube 50 by extending telescoping extension arm 40a therein which carries fluid power means 90, rod 86 and wedge member 80 thereon. Similarly, if the cross section of tube 50 is modified, due to a change in the type of parts being dispensed, a different wedge member 80 will be attached to the end of rod 86 to provide proper engagement with the new tube 50.

Referring now to FIGS. 5A–5D, support member 30 is shown in FIG. 5A in its parts dispensing position with fluid power means 90 urging rod 86 and wedge 80 thereon against and into the end of tube 50 to maintain the opposite end of tube 50 in and against work station 70. A stripper arm 88 mounted to extension arm 40a is located slightly behind tube 50, but close enough to engage the end of tube 50 when the tube is withdrawn from station 70 by the action of fluid power means 90 and rod 86 and wedge 80 attached thereto.

Figure 9:
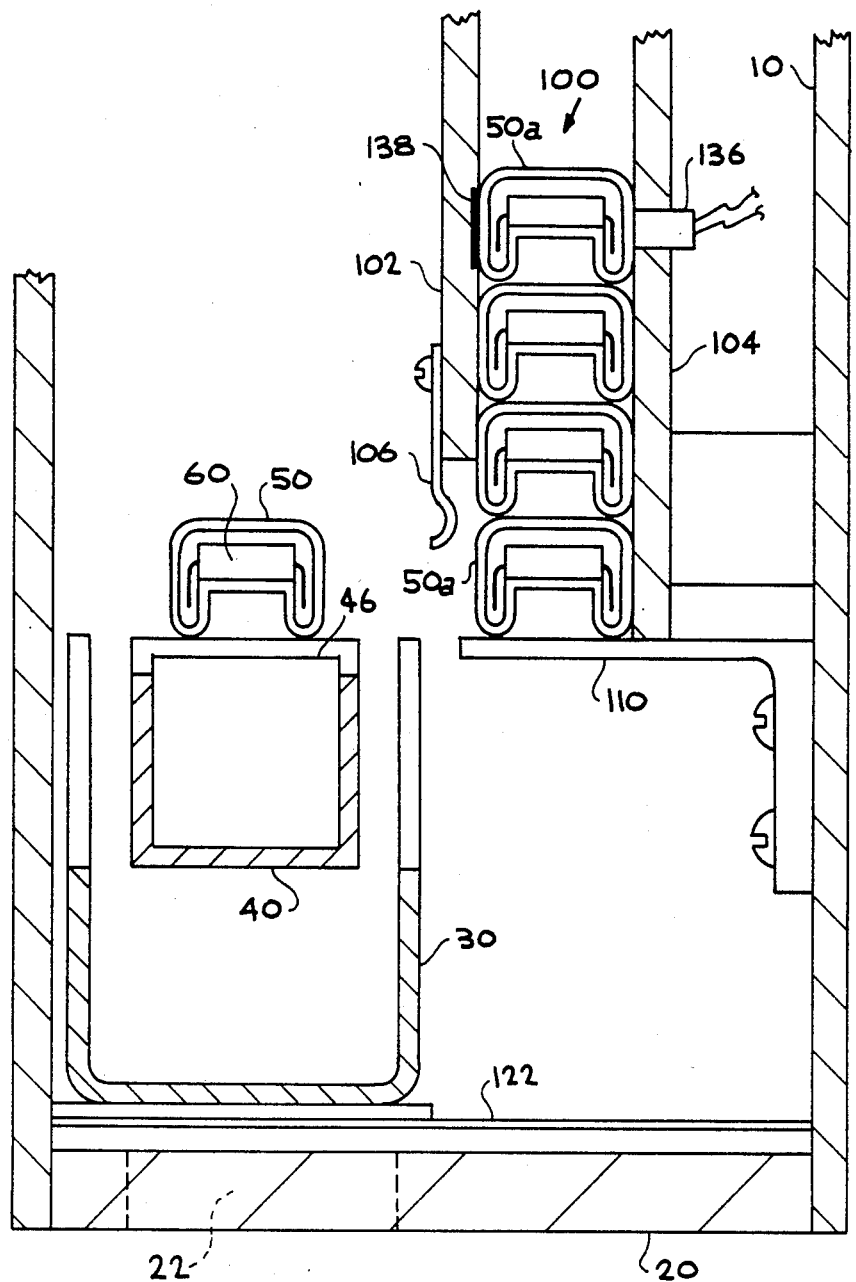
FIG. 9 is a vertical end-section view of a portion of the device of the invention illustrating the storage of full tubes of parts to replace an empty tube.
Figure 10:
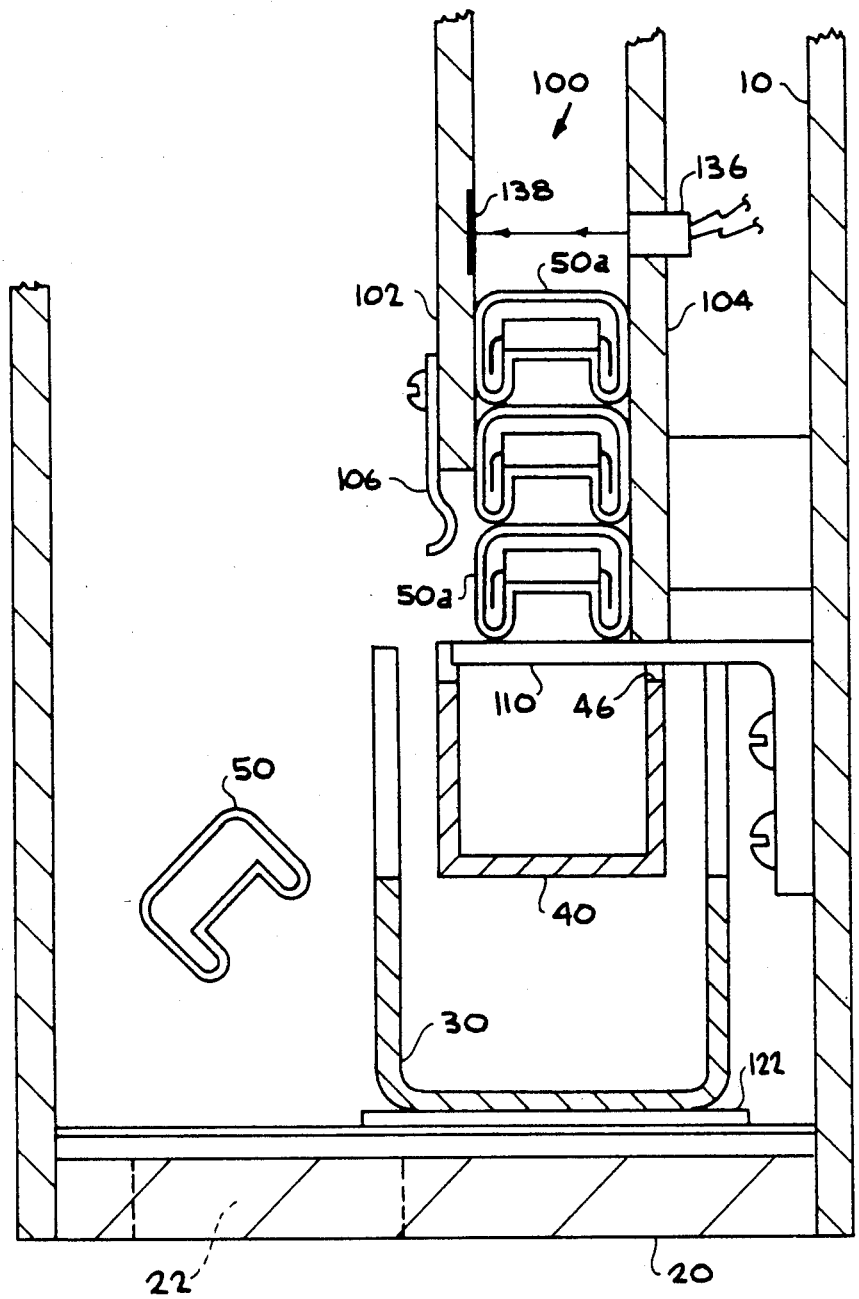
FIG. 10 is a vertical end-section view of the mechanism of FIG. 9 illustrating a new tube full of parts being moved into an unloading position.

Adjacent to support member 30 in case 10 is a stack 100 of tubes full of parts to replace the empty tube 50E when all parts have been dispensed. Tube stack 100 is vertically positioned between fixed stack wall 102 and adjustable stack wall 104 which may be moved or interchanged with a thinner or thicker wall to accommodate different dimensions of tubes. A spring steel wiper or spring 106 attached to wall 102 depends downwardly a sufficient distance (as also seen in FIGS. 9 and 10) to assist in directing a new tube into engagement with station 70 as will be described, as well as assisting in the removal or ejection of the empty parts tube.

As shown in FIG. 5B, tube 50E has been withdrawn from station 70 by action of fluid power means 90 to retract rod 86 and wedge 80 thereon. The frictional engagement of wedge member 80 against the inner surfaces of the flexible sidewall of tube 50E causes tube 50E to retract with wedge 80 and rod 86 until the end edge of tube 50E is contacted by stripper 88 which forces tube 50E off wedge 80.

After withdrawal of empty tube 50E from station 70, the entire support member is moved to a position under the stack 100 of full tubes as shown in FIG. 5C. As support member 30 moves laterally, the empty tube, if still resting on arm 40, will come in contact with spring 106, as best seen in FIGS. 9 and 10 as well as FIG. 5C, to sweep empty tube 50E off arm 40 and through an appropriate opening 22 in base 20 of the apparatus.

Then, as shown in FIG. 5D, first fluid power means 90 urges rod 86 and wedge 80 into contact with the new full tube 50 pushing it forward into notch 71 in work station 70 with the guiding assistance of the cammed edge 66 on guide 62 and spring 106 to insure alignment between work station 70 and the internal track within tube 50. When the front end of tube 50 is engaged in proper alignment with work station 70 with the other end of tube 50 gripped by wedge 80 therein, support member 30 is ready to be moved back to the dispensing position.

Figure 6:
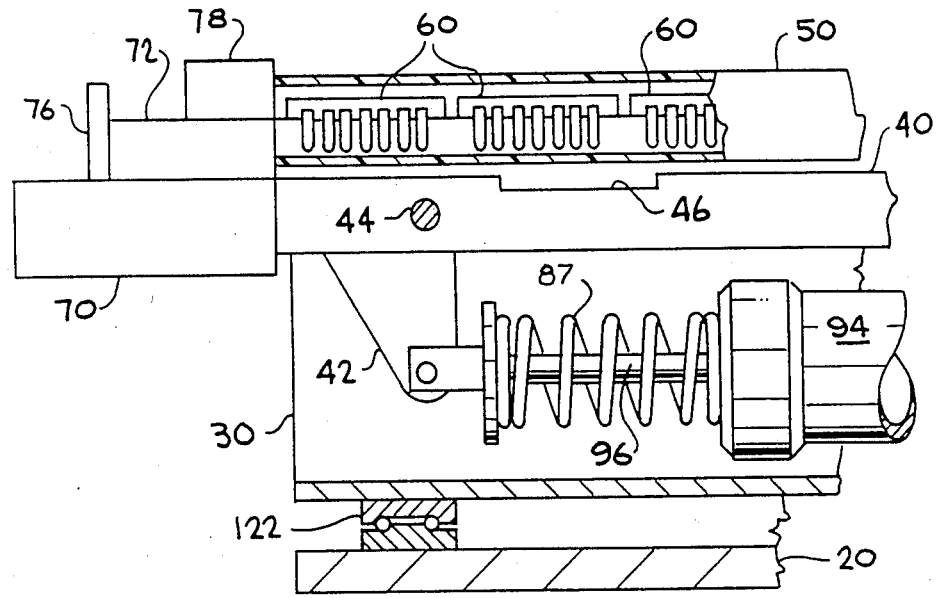
FIG. 6 is a vertical side-section view of a portion of the device of the invention prior to feeding of a part of the work station.
Figure 7:
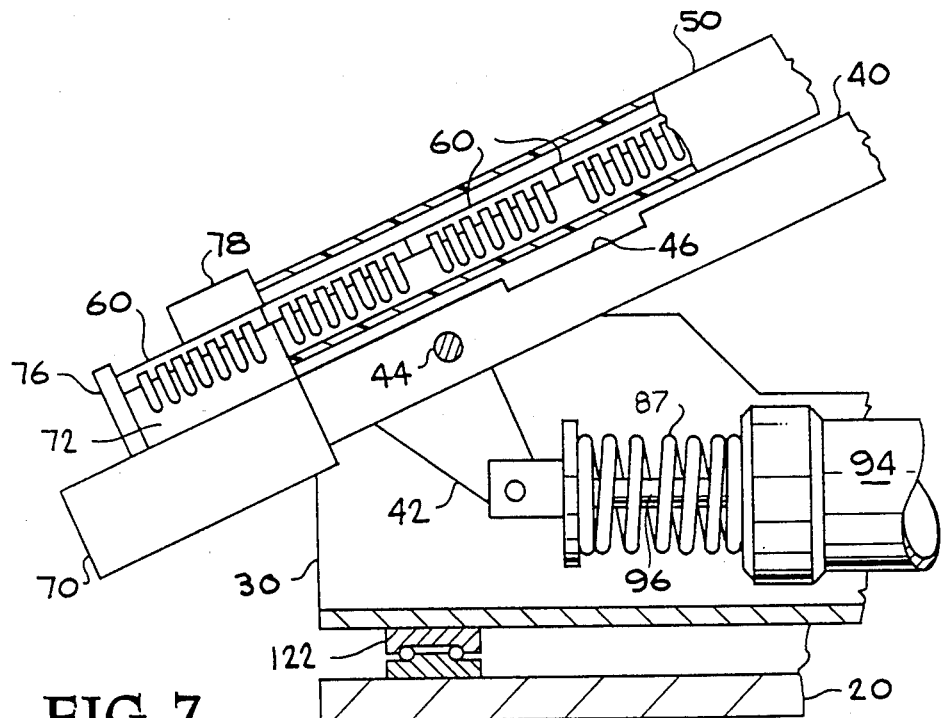
FIG. 7 is a vertical side-section view of the mechanism of FIG. 6 showing the tube in a tilted position as a part is fed to the work station.

After a new full tube 50 containing parts 60 has been positioned on arm 40 in alignment with station 70 and support member 30 has been moved back to the parts dispensing position, as shown in the side view of FIG. 6, arm 40 is pivoted upwardly, as shown in FIG. 7, to permit the first part 60 in tube 50 to slide onto part receiving member 72 in work station 70 where it engages end stop 76.

Arm 40 is tilted or pivoted upwardly by second fluid power means 94 which is mounted on support member 30. Fluid power means or second means 94 are connected by piston rod 96 to an extension 42 which downwardly depends from arm 40. When fluid power means 94 is actuated to withdraw rod 96, arm 40 pivots upward around pivot point 44. This permits a part 60 adjacent the end of tube 50 to slide out of tube 50 onto part receiving member 72 in work station 70. Subsequent actuation of cylinder 94 to extend rod 96, returns arm 40 to the horizontal position, as shown in FIG. 8, leaving part 60 on part receiving member 72 for subsequent removal, e.g., robotic removal, before the next part 60 is loaded onto part receiving member 72 in work station 70 by again tilting arm 40.

Referring again to FIG. 7, it will be noted that when arm 40 is tilted into the raised position, all of the parts 60 are abutting each other due to the angle of arm 40 and the action of gravity. In some prior art applications, this would be the normal feed position at which tube 50 would be constantly maintained. Removal of the part 60 on part receiving member 72 manually or by a robotic arm would, in the prior art, then result in the immediate feeding of another part 60 onto part receiving member 72. In some instances, this could interfere with the pickup of the first part, due to its frictional engagement with the subsequent part, or cause accidental dislodgment of the second part as it slid into the part receiving station. Additionally, the weight of all of the parts in tube 50 on the bottom part could also interfere with its removal from the work station, particularly when tube 50 is full.

Figure 8:
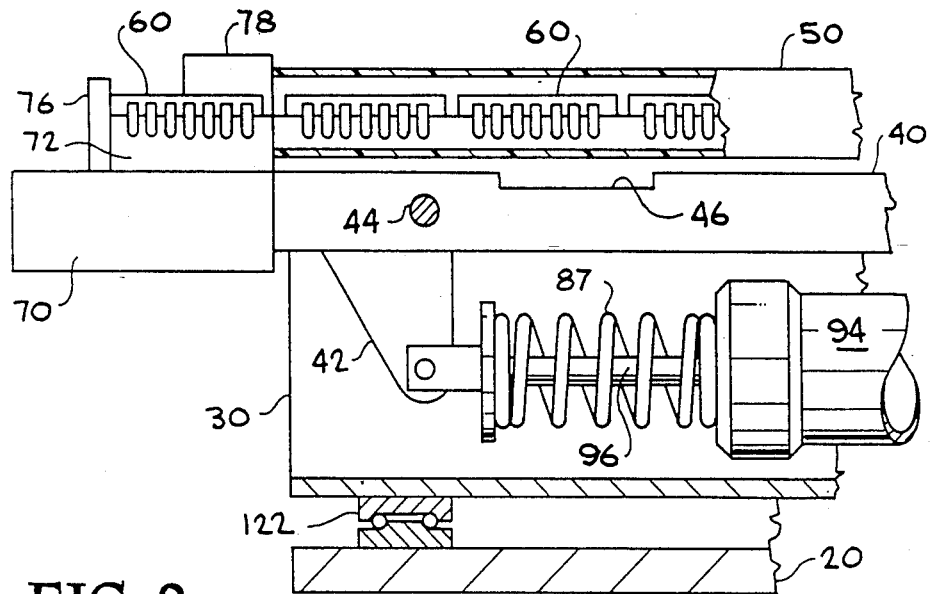
FIG. 8 is a vertical side-section of the mechanism of FIG. 6 after feeding an individual part to the work station.

However, in accordance with the invention, arm 40 is returned to its horizontal position, as shown in FIG. 8, prior to removal of part 60 from part receiving member 72. Furthermore, by properly regulating the fluid supplied to fluid power means 94 and/or the pressure of the fluid via a pressure regulator, arm 40 may be caused to fall just sharply enough to provide a slight bounce which will have the effect of slightly separating the parts 60 remaining in tube 50 as well as providing a slight space between the part 60 on part receiving member 72 and the last part 60 in tube 50. Subsequent removal of part 60 from part receiving member 72 will then have no effect on other parts in tube 50. Control over the angle to which arm 40 is raised, as well as both the speed of ascent and descent of arm 40 may be controlled through control of fluid power means 94.

It will also be noted in FIGS. 6-8, that a spring 87 has been provided to damp the action of fluid power means 94, with the action of the spring in compression acting more strongly against fluid power means 94 as the angle of tilt is increased. This angle of tilt can also be adjusted when necessary by proper adjustment of the travel of fluid power means 94.

After the last part 60 is removed from tube 50, empty tube 50 must be removed and replaced with a full tube 50a as previously discussed with respect to the top views of the feeding apparatus shown in FIGS. 5A-5D. This is accomplished, as shown in FIGS. 9-12, by moving support member 30 sideways under a vertical tube stack 100, comprising vertical walls 102 and 104, filled with full tubes 50a and supported by fingers 110 which extend under the bottom-most full tube 50a toward arm 40.

Vertical tube stack 100 is capable of holding a number of full tubes and is accessible from either the side or the rear of the apparatus, i.e., the opposite end from work station 70 thus permitting restocking without interfering with the unloading of individual parts from the tube in position on arm 40. A tube sensor 136 may be located on stack wall 104 comprising a source of light and a light sensing means designed to detect reflected light from the side of a full tube. A black or non-reflective spot 138 placed on opposite stack wall 102 adsorbs the light and the non-reflectance indicates the absence of tubes in the stack to alert the operator to replenish the supply.

As support member 30 and arm 40 move under tube stack 100, fingers 110 slide into grooves 46 in arm 40 as shown in FIGS. 6-8 and 10. Fingers 110 are positioned slightly below the top surface of arm 40 so that when arm 40 is positioned beneath tube stack 100, the weight of the bottom tube will be on arm 40, not fingers 110. This assists in retaining the full tube 50a on arm 40 as arm 40 and support member 30 move back to the normal unloading position.

When a tube 50 is emptied and support member 30 and arm 40 are to be moved under tube stack 100, fluid power means 90 are actuated, as previously described, to withdraw rod 86 and wedge member 80 with the aid of stripper 88 from tube 50 to release empty tube 50. This permits empty tube 50 to fall away, or be pushed aside by spring 106 as support member 30 and arm 40 move under tube stack 100. Cylinder 90 is then actuated in the opposite direction to urge member 80 against new tube 50a pushing it against and into engagement with work station 70.

It should be further noted, in this regard, that in the preferred embodiment, the entire design of the apparatus reflect the ability to locate a number of these devices side by side with the width of the device generally comprising the width of arm 40 and its support member 30 plus the additional width of tube stack 100, e.g., about 3 inches or so. Thus preferably, the design provides for the ejectment of empty tube 50 through the bottom of the device rather than the side since a side exit would interfere with the placement of adjoining devices.

Turning now to FIGS. 11 and 12, sideways movement of support member 30 and tilting arm 40 thereon is controlled by an fluid power means 114 which is mounted to base 20 and connected to arm 118 and strip 112 via piston rod 116. When fluid power means 114 and rod 116 are in an extended position, as shown in FIG. 11, support member 30 and tilting arm 40 are in their normal part unloading position.

However, when part tube 50 is emptied of parts 60 and a new part tube 50a must replace tube 50, air cylinder 114 is actuated to withdraw rod 116 as shown in FIG. 12. This, in turn, also moves arm member 118 and strip 112 in the same direction, i.e., toward the right in FIG. 12, causing arms 126 to move on their pivot points 128 and 130 to move support member 30 normal to the movement of strip 112. Direction of movement of support member 30 perpendicular to the movement of strip 112 is, in turn, controlled by depending fingers or pins 120a and 120b which extend downward from support member 30 to ride in respective guide tracks 122a and 122b.

As previously described, when empty tube 50 is to be replaced by full tube 50a from tube stack 100, air cylinder 90 is actuated to move member 80 back from engagement with tube 50, thus releasing tension on tube 50. Air cylinder 114 is then actuated to move support member 30 and arm 40 sideways under magazine 100 to obtain a new full tube 50a. When support member 30 and arm 40 have been positioned under tube stack 100, fluid power means 90 is again actuated to urge wedge member 80 against and into the end of the new full tube 50a and to urge the opposite end of tube 50a into engagement with work station 70.

While maintaining this tension on new tube 50a, air cylinder 114 is actuated in its opposite position to return support member 30 and arm 40, with new full tube 50a thereon, back to the normal unloading position where each part 60 can then be individually unloaded from tube 50a onto part receiving member 72 in work station 70 by the periodic tilting of arm 40 as previously described.

Thus, it will be seen that the entire mechanism is controlled by the operation of three fluid power means, both to load the full tubes onto arm 40 and to individually unload the parts 60 from tube 50 onto part receiving member 72 for subsequent manual or robotic engagement to be inserted into a socket or for whatever other purpose it is desired to individually unload the parts from tube 50.

Control of the three fluid power means may, in turn, be manual as, for example, by the manual actuation of fluid power means 94 each time a part is visually seen to be removed from part receiving member 72 to replace it with the next part in tube 50 by tilting of arm 40 or the control may be automatic, using a programmable control center such as, for example, the SMC Cylinder Controller ECC50, commercially available from the SMC Company.

Using such a control device, the cycle time for unloading of each part may be programmed into the device to control the actuation cycle of air cylinder 96; to control the actuation of cylinder 90; and the number of parts in each tube; and to control the actuation of cylinder 114 to replace the empty tube with a new one.

Thus, the invention provides a novel part feeder wherein a tube holding a number of parts such as, for example, integrated circuit chip packages is normally maintained in a horizontal position and intermittently tilted sufficiently to permit exit by gravity of one part from the tube to a work station followed by return of the tube to the horizontal position.

Furthermore, the invention provides for means for storing of a vertical stack of additional full tubes which is independently accessible for restocking without interfering with tilting of the tube being unloaded. After emptying of the tube being unloaded, the invention provides for the disposal of the empty tube and replacement with a full tube from the tube stack.

Having thus described the invention, what is claimed is:

1. A part feeder capable of moving individual parts to a work station from a storage tube having an internal track therein generally conforming in vertical cross-section to at least a portion of the vertical cross-section of one or more parts stored within the tube to permit said parts to freely slide along said track within the tube, said part feeder comprising:
    (a) a base;
    (b) a support member and means slidably mounting said support member on said base;
    (c) a tiltable arm member pivotally mounted on said support member;
    (d) a work station on said tiltable arm member;
    (e) first means for releasably securing one end of said tube on said arm member against said work station;
    (f) second means for sufficiently tilting said arm member so that said end of said tube adjacent said work station is sufficiently lower than the remainder of said tube to permit one part in said tube to slide out of said tube into said work station; and
    (g) means for returning said arm member and said tube thereon back to a horizontal position.

2. The device of claim 1 wherein said work station comprises:
    (a) part receiving means on said arm member in alignment with said tube to receive said part from said tube, said part receiving means having a vertical cross-section generally conforming to said internal track in said tube to facilitate sliding of said part from said tube to said part receiving means;
    (b) end stop means on said arm member adjacent an end of said part receiving means opposite said tube to prevent said part sliding from said tube onto said part receiving means from sliding off of said part receiving means;
    (c) tube stop means engaging the end of said tube facing said work station, said tube stop means being positioned adjacent the edge of said work station facing said tube to thereby locate the end of said tube immediately adjacent the end of said part receiving means whereby said part receiving means will act as a continuation of said internal track to facilitate sliding of said part from said tube to said part receiving means; and (d) detection means for sensing the presence of a part in said work station.

3. The device of claim 2 wherein said part receiving means further include cammed surfaces facing said tube to assist in guiding a part from said tube into said work station.

4. The device of claim 2 wherein said first means for releasably securing said tube against said work station comprises first fluid power means having means operationally attached thereto to engage an opposite end of said tube to urge said tube against said work station.

5. The device of claim 4 wherein said means operationally attached to said first fluid power means include wedge means to engage the inner surfaces of the end of said tube to assist in aligning said tube on said tilting arm member and in withdrawing the opposite end of said tube from engagement with said work station after said tube is empty.

6. The device of claim 5 wherein said tilting arm member is further provided with a guide member located between said work station and said wedge means to guide said tube into alignment with said work station to assist in removal of said parts from said tube.

7. The device of claim 4 wherein the length of said tilting arm is adjustable to compensate for differing lengths of said tube containing parts to be unloaded.

8. The device of claim 1 wherein said second means for tilting said arm member comprise second fluid power means.

9. The device of claim 8 wherein said second fluid power means are adjustable to control the angle to which said arm member is tilted and to control both the speed at which said arm member is tilted and returned to the horizontal to permit spacing out of the remaining parts in said tube by providing a controlled jarring action on said tube upon returning said arm member and said tube thereon to the horizontal position.

10. The device of claim 1 wherein said part feeder further includes storage means for storing a vertical stack of full tubes in a vertical plane parallel to but spaced from the plane defined by said tilting arm member to permit replenishment of said tubes in said tube stack without interfering with the unloading of said tube affixed to said tilting arm member.

11. The device of claim 10 which further includes stripper means for disengaging said tube on said tilting arm member from said wedge member when said tube is empty, third means for moving said tilting arm member and said support member to which it is attached to a position beneath said tube stack to receive a full tube in replacement of said empty tube, and spring means operationally attached to a wall of said tube stack to assist in removing an empty tube from said tilting arm member when said arm member is moved under said tube stack.

12. The device of claim 11 wherein said third means for moving said support member and said tilting arm member comprise third fluid power means mounted to said base and operationally attached to said support arm to provide sideways movement of said support arm to and from a position beneath said tube stack.

13. The device of claim 12 wherein said third fluid power means are operationally attached to said support member by pivotally attached levers capable of translating movement created by said third fluid power means that is parallel to said support member to horizontally move said support member in a direction perpendicular to the movement created by said third fluid power means to thereby conserve the width dimension occupied by said part feeder to facilitate location of other similar devices adjacent said part feeder.

14. The device of claim 13 wherein said support member is further provided with one or more pins depending from the under surface thereof into tracks in said base perpendicular to said support member to assure the accuracy of said horizontal movement of said support member to a position under said tube stack.

15. The device of claim 14 which further includes means for determining the presence or absence of one or more full tubes in said tube stack.

* * * * *